(12) United States Patent
Colbert et al.

(10) Patent No.: US 7,550,840 B2
(45) Date of Patent: Jun. 23, 2009

(54) APPARATUS FOR EFFECTING RELIABLE HEAT TRANSFER OF BARE DIE MICROELECTRONIC DEVICE AND METHOD THEREOF

(75) Inventors: John Lee Colbert, Byron, MN (US); Justin Christopher Rogers, Rochester, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 11/766,997

(22) Filed: Jun. 22, 2007

(65) Prior Publication Data

US 2007/0241449 A1 Oct. 18, 2007

Related U.S. Application Data

(63) Continuation of application No. 11/013,151, filed on Dec. 15, 2004, now Pat. No. 7,339,266.

(51) Int. Cl.
*H01L 23/34* (2006.01)

(52) U.S. Cl. .................. 257/712; 257/718; 438/122
(58) Field of Classification Search ........... 257/712, 257/706, 718; 438/122
See application file for complete search history.

(56) References Cited

U.S. PATENT DOCUMENTS

| 5,533,256 A | 7/1996 | Call et al. |
| 5,883,782 A | 3/1999 | Thurston et al. |
| 5,990,552 A * | 11/1999 | Xie et al. .................... 257/718 |

FOREIGN PATENT DOCUMENTS

| CN | 2582169 Y | 10/2003 |
| WO | 2004/097937 A1 | 11/2004 |

* cited by examiner

*Primary Examiner*—Roy K Potter
(74) *Attorney, Agent, or Firm*—Matthew C. Zehrer

(57) ABSTRACT

Apparatus and method include using a bare die microelectronic device; a heat sink assembly; a heat sink mounting assembly for mounting the heat sink assembly independently of the bare die microelectronic device; and, a force applying mechanism that compression loads, under controlled forces, a surface of the bare die into a direct heat transfer relationship at a thermal interface with a heat sink assembly.

11 Claims, 3 Drawing Sheets

APPARATUS FOR EFFECTING RELIABLE HEAT TRANSFER OF BARE DIE MICROELECTRONIC DEVICE AND METHOD THEREOF

CROSS REFERENCE TO RELATED APPLICATIONS

The present application is a continuation application of U.S. patent application Ser. No. 11/013,151, filed Dec. 15, 2004, titled "APPARATUS FOR EFFECTING RELIABLE HEAT TRANSFER OF BARE DIE MICROELECTRONIC DEVICE AND METHOD THEREOF", which is hereby incorporated by reference herein in its entirety.

BACKGROUND OF THE INVENTION

The present invention relates generally to methods and apparatus for effectively dissipating heat reliably in compact processor components that are particularly adapted for computing systems, high performance game systems, and other high performance microelectronic applications.

Electronic servers and processors generate significant amounts of heat while performing their jobs. Advancing high-density semiconductor systems have increased the demands placed on their thermal management. Such demands are attributable to requirements for higher power resulting from the higher speed microprocessors, integrated circuits, and other electronic components.

Processor components include a processor bare die containing the micro-circuitry of the processor. Heat is generated in the processor bare die, largely by the power required to drive high-frequency operations. In some cases, almost all of this power is dissipated as heat. With the high degree of power generated in more advanced chips, significant heat issues arise. In some cases, processors dissipate over 280 watts of power in a relatively small space and overheat. For example, as the processor bare die overheats, the timing characteristics of signals may change, thereby causing intermittent operation and perhaps failure of the processor. Accordingly, successful heat transfer is extremely important for the components and systems to perform as intended.

One known heat transfer approach is for having bare die processors encapsulated underneath a sturdy heat spreader that is coupled to a heat sink. The heat spreader not only serves to spread the heat, but also protects the bare die processor. However, such spreader plates tend to inhibit heat transfer because there are two thermal interfaces involved; one between the bare die and the heat spreader, and the second between the heat spreader and the heat sink. Attempts to transfer heat directly from the bare die through a single thermal interface have been made. However, the direct mounting of the heat sink on the bare die presents enormous potential problems insofar as the latter are fragile and relatively easily breakable.

Accordingly, without the ability to transfer heat successfully and reliably directly from processor bare dies without the latter breaking or fracturing, the potential of highly effective heat transfer may not be entirely achieved. As such, there is a need to do so in a reliable and economic manner, in order to support high frequency and power requirements of the processor chips.

SUMMARY OF THE INVENTION

This invention is related to methods and apparatus for effectively dissipating heat reliably in compact processor components that are particularly adapted for computing systems, high performance game systems, and other high performance microelectronic applications without negative effect and that overcome many of the disadvantages of prior art.

In an illustrated embodiment, there is provided an apparatus comprising: a bare die microelectronic device; a heat sink assembly, a heat sink mounting assembly for mounting the heat sink assembly independently of the bare die microelectronic device; and, a mechanism that loads a surface of the bare die microelectronic device into a direct heat transfer relationship at a thermal interface with a heat sink assembly under controlled forces applied by the mechanism.

In an illustrated embodiment, there is provided a method of transferring heat from a bare die microelectronic device comprising: supporting a heat sink assembly independently of a bare die microelectronic device; and, urging a surface of a bare die microelectronic device into direct heat transfer relationship at a thermal interface with the heat sink assembly under controlled forces applied by the mechanism.

These and other features and aspects of this invention will be more fully understood from the following detailed description of the preferred embodiments, which should be read in light of the accompanying drawings. It should be understood that both the foregoing generalized description and the following detailed description are exemplary, and are not restrictive of the invention.

DETAILED DESCRIPTION

Figure 1:
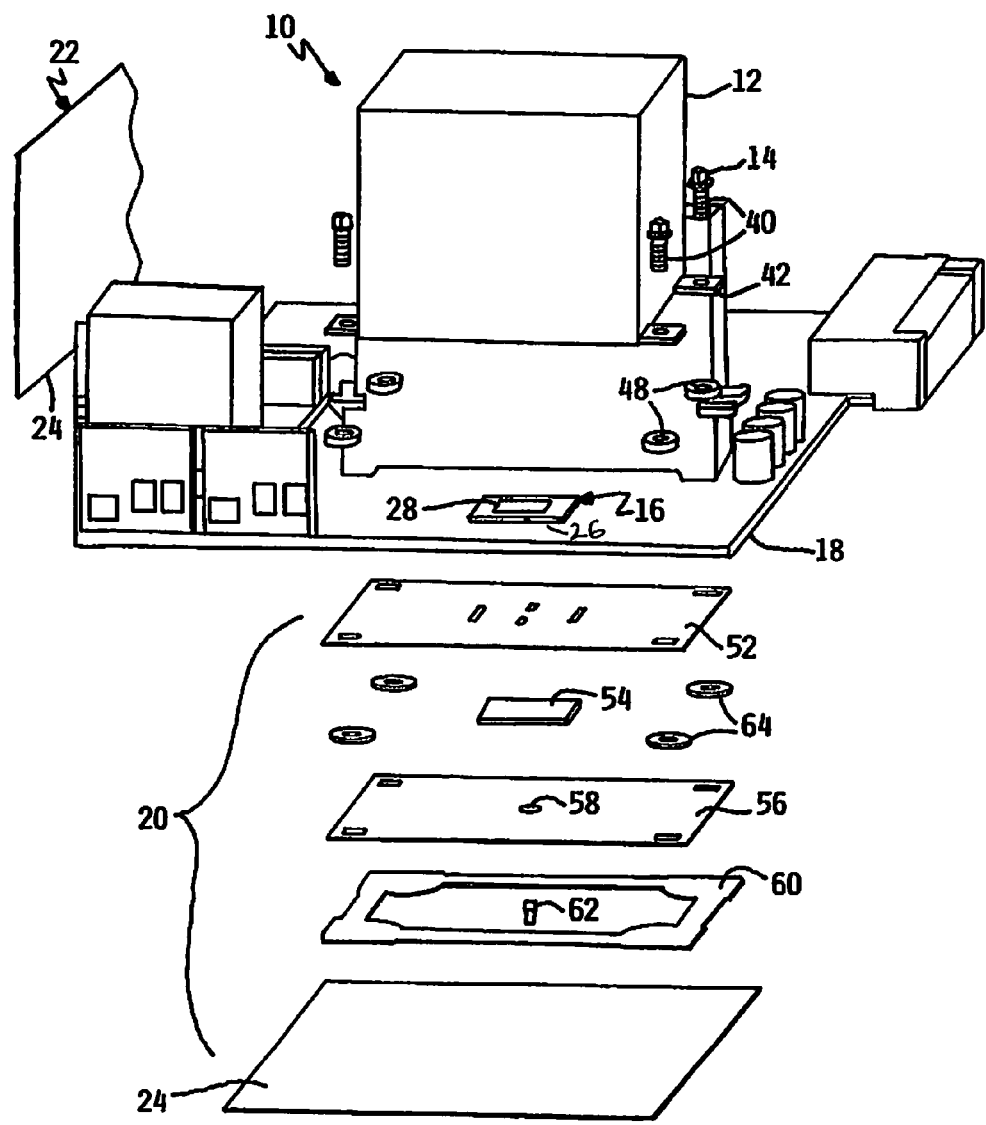
FIG. 1 is an exploded perspective view of a heat transfer assembly of the present invention.
Figure 2:
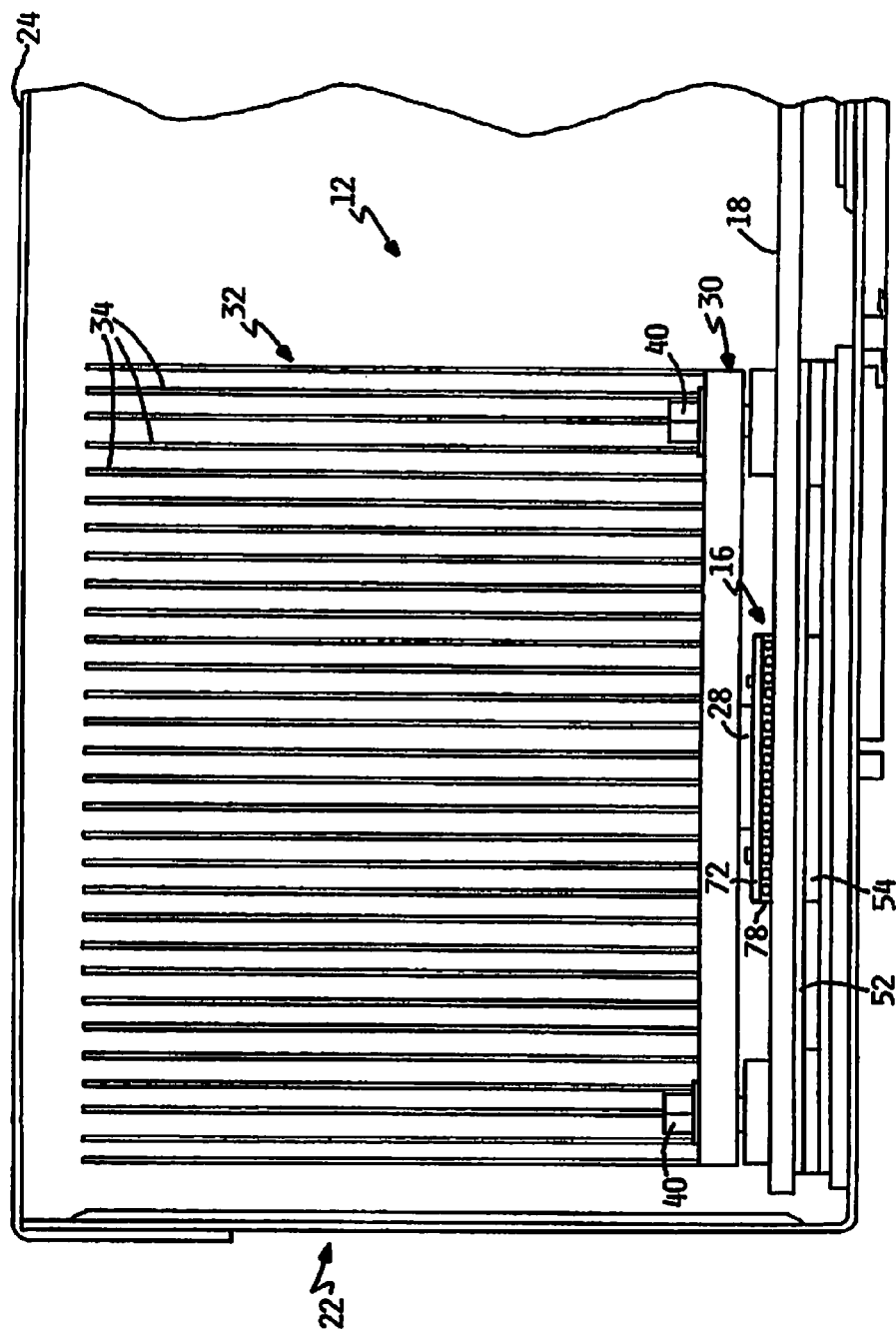
FIG. 2 is an elongated side elevation view of the heat transfer assembly depicted in FIG. 1.
Figure 3:
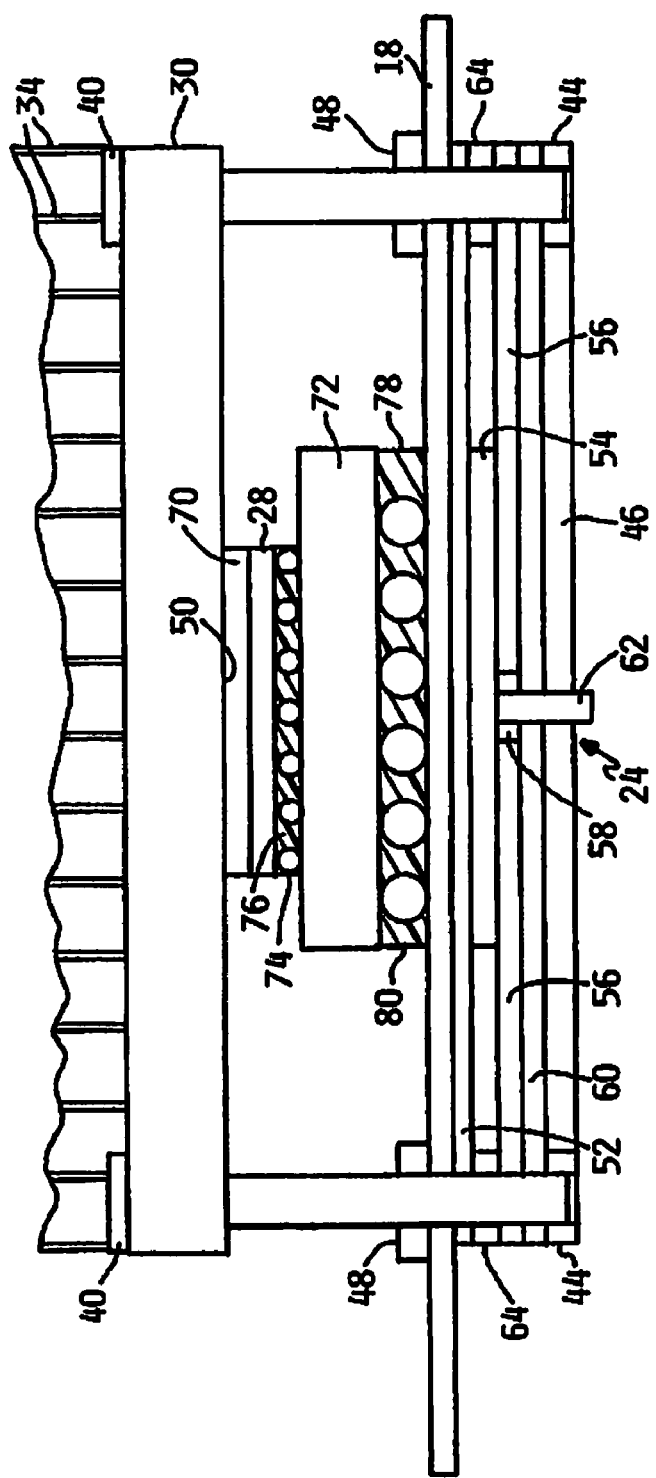
FIG. 3 is an enlarged side elevation view, partly in cross-section, of the bare die microelectronic device on the present invention along with a force applying assembly that urges the bare die microelectronic device into intimate heat transfer engagement with a heat sink assembly.

FIGS. 1-3 illustrate one preferred embodiment of a heat transfer assembly 10 made in accordance with the principles of the present invention. Included in the heat transfer assembly 10 are a heat sink assembly 12, a heat sink mounting assembly 14, a bare die microelectronic device 16, a printed circuit board 18, and a force applying assembly 20 that are adapted to be mounted within a computer system 22 having a housing assembly 24, such as a computer server system housing assembly 24.

The bare die microelectronic device 16 includes a semiconductor bare die or chip assembly 26 containing a semiconductor bare die 28. The semiconductor bare die 28 contains the micro-circuitry of the microelectronic device 16. Heat is primarily generated here largely because of the power to drive the high frequency, logic-level transitions. In a preferred embodiment, the bare semiconductor bare die 28 may be of the type, such as PowerPC® that is commercially available from International Business Machines Corporation, Armonk, N.Y. While the present invention is directed towards mounting a heat sink on a bare die, it is not intended to be so limited.

The illustrated heat sink assembly 12 includes a base portion 30 and a fin portion 32. The base portion 30 may be comprised of a rectangular prism having sufficient size and thermal conductivity to effectively conduct heat from the semiconductor bare die 28 evenly over the entire base portion. Embodiments envision thermally conductive materials, such as aluminum or copper. Clearly, other suitable thermally conductive materials and those yet to be developed materials may be utilized. The fin portion 32 comprises a plurality of thermally conductive fins 34 that transfer heat from the base portion 30 to air inside the computer system housing assembly 24. In this regard, the thermally conductive fins 34 are ideally made of highly thermally conductive materials, such as copper. Clearly, other suitable thermally conductive materials and those yet to be developed may be utilized.

The printed circuit board 18 may have a generally elongated and thin construction mounted by suitable structure (not shown) within the housing assembly 24. The printed circuit board 18 carries the bare die microelectronic device 16 and with other components thereon, but the other components do not, per se, form aspects of the present invention.

The heat sink mounting assembly 14 may include mounting posts 40 that cooperate with openings in lugs 42 formed integrally with the heat sink assembly base. The mounting posts 40 extend thru openings in the printed circuit board 18 and are secured threadedly to corresponding ones of standoffs 44 supported by a chassis wall structure 46 of the housing assembly 24. By tightening the mounting posts 40, as by rotating them, the heat sink assembly is displaced towards the bare die. Accordingly, the heat sink assembly 12 is mounted and supported directly by the chassis wall structure 46 and not directly on the bare die structure. Significantly, loading issues of the heat sink assembly directly on the bare die are removed from consideration; other than the loading applied by the force applying assembly 20 to be described hereinafter. This is significant in terms of minimizing the direct loading on the bare die by the heat sink assembly. As a result, there is less of a tendency for the bare die to fracture or otherwise become damaged while at the same time effecting highly efficient heat transfer. While the mounting posts 40 are utilized for applying controlled forces, the present invention contemplates other mechanisms for applying forces for urging the bare die microelectronic device towards the heat sink assembly.

Spacers or shims 48 are interposed between the bottom surfaces of the lugs 42 and an upper surface of the printed circuit board 18 surrounding the mounting posts 40. The spacers or shims 48 are utilized for purposes of maintaining printed circuit board planarity under the loading conditions of the present invention. The arrangement of the spacer 48 serves to minimize undesired stresses at a thermal interface 50 between the heat sink assembly and the bare die microelectronic device. The material selected for the spacers should not relax over time after initial compression during loading. Otherwise, any retention forces provided by the resilient foam material are reduced with the passage of time, thereby decreasing actuating load.

In the illustrated embodiment, the force applying assembly 20 serves to load the bare die microelectronic device 16 into thermal engagement with the heat sink to maintain a uniform thermal interface between the latter. As a consequence, the bare die 28 may be loaded in a controlled manner into intimate engagement with the heat sink base portion with sufficient force to maintain a uniform engagement while avoiding being fractured or otherwise damaged under loading. As a result, only a single thermal interface is required for affecting the heat transfer in a reliable manner.

In an exemplary embodiment, the force applying assembly 20 includes essentially an insulator substrate or pad 52, a stiffener element 54, a spring plate 56, a bushing 58, a foam substrate or pad 60, and an actuating member 62, such as screw 62.

The insulator substrate or pad 52 may be made of a thin elastomeric material that is sandwiched between a bottom surface of the printed circuit board 18 and the spring plate 56. The insulator pad 52 serves to protect the circuit board 18. The insulator pad 52 has openings for components, such as capacitors, that are mounted on the printed circuit board. The insulator pad 52 has openings for allowing the mounting posts to pass therethrough. For the insulator pad 52, the present invention envisions resiliently deformable materials, such as a polycarbonate-based Lexan® that is commercially available from General Electric. Clearly, other suitable resiliently deformable materials, such as high-density elastomers and non-conductive metals may be utilized, as well as those yet to be developed.

The stiffener element 54 may be positioned beneath the insulator pad 52. The actuating member 62 acts directly on it for transferring the loading forces of the force applying assembly 20. The stiffener element 54 may be a metallic plate having the size of at least the bare die 28, and being made of a suitably rigid yet thermally conductive material, such as aluminum or steel. Interposed between the insulator pad 52 and the spring plate 56 are spacers 64. The spacers 64 are made of a resilient material that enable them to control deflection of the printed circuit board in a manner to keep the latter relatively planar during loading. The material selected for the spacers 64, preferably, should not relax over time after initial compression during loading. Otherwise, the retention forces provided by the resilient foam material are reduced with the passage of time, thereby decreasing actuating load. This also minimizes the occurrence of a faulty thermal interface over time. In an exemplary embodiment, the spacers 64 may be made of high density, low creep foam or the like. An exemplary embodiment of such foam is Pureon 800 made by Rogers Corporation, Minneapolis, Minn. Clearly, other embodiments envision other kinds of materials.

The spring plate 56 is made of a deflectable plate(s) that provides for adjustable clamping forces. The spring plate 56 biases the stiffener element 54 against the insulator pad 52 and the printed circuit board 18 when the spring plate 56 is displaced as will be described. In this regard, a bushing 58 is affixed to the center of the spring plate 56 and is threadedly coupled to the actuating member 62. The spring plate 56 will bow upwardly as viewed in the drawings in response to the actuating member 62 being rotated in a known manner. The actuating member 62 is threadedly connected to the computer housing assembly 24 and may be externally actuated by a user. The spring plate 56 may be actuated to provide adequate load levels to maintain a firm engagement at the thermal interface 50. In the present embodiment, a loading of about thirty-five (35) pounds are used. While a single spring plate and load actuating device are disclosed, the present invention is not so limited. Other force levels, of course, are envisioned for affecting a good heat transfer relationship at the thermal interface 50 depending on the materials and circumstances involved.

A resilient foam substrate or pad 60 preferably made of the same material as the spacers are interposed between the housing assembly and the spring plate. The resilient foam substrate or pad 60 supports the loading of the spring plate. The material selected for the resilient foam substrate or pad 60 should not relax over time after initial compression during loading. Otherwise, the retention forces provided by the resilient foam material are reduced with the passage of time, thereby decreasing actuating load. This also minimizes the occurrence of a faulty thermal interface over time.

Reference is now made to FIG. 3 for illustrating the single thermal interface 50 between the bare die microelectronic device and the heat sink assembly. A thermal interface material 70 provides a good thermal path to the heat sink. Many kinds of materials are contemplated for use as the thermal interface material 70, such as a thermal grease 70. Any suitable thermal grease may be utilized. Alternative embodiments for the thermal interface materials include thermal pads, epoxies, phase change materials (e.g., waxes or polymers) and elastomers. The thermal interface materials 70 may include a fine metallic powder with high thermal conductivity. In an exemplary embodiment, the thermal interface material 70 may be 2 mils thick.

A bottom surface of the semiconductor bare die 28 is mounted directly on a ceramic dielectric substrate 72 though a suitable surface mount assembly, such as a ceramic ball grid array assembly 74. The ceramic ball grid array assembly 74 may include a fine pitch solder ball grid, such as in the order of about 1574 balls for an area of about 52 mm by 52 mm. Other surface mount technology may be used instead of the ball grid array assembly. Preferably, the present invention envisions the use of adhesive filler material(s) 76 interposed in the ball grid array assembly 74. The adhesive filler material 76 serves to inhibit or prevent any grounding of the solder balls when loading forces are applied to such an extent that the solder balls are undesirably deformed. Also, the adhesive filler material 76 serves to promote heat transfer by eliminating air voids in the interstices of the ball grid array assembly. The adhesive filler materials selected may act, preferably, to prevent relaxation of compression forces urging the bare die into engagement with the heat sink at the thermal interface 50. Moreover, the adhesive filler material 76 may also include some metallic powder, such as alumina. This is done in order to serve as an additional heat path. In an exemplary embodiment, the adhesive filler materials are preferably epoxy adhesives. In this embodiment, an epoxy adhesive, such as Hysol FP 6110 that is commercially available from Loctite Corp. may be utilized. Other adhesive filler materials are, of course, contemplated.

The ceramic dielectric substrate 72 is mounted, in turn, on a ceramic ball grid array assembly 78. The ceramic ball grid array assembly 78 is, in turn, surface mounted on the printed circuit board 18 in a known manner. The ceramic ball grid array assembly 78 may be provided with an adhesive filler material(s) 80 that serves as an adhesive; much as in the manner noted above in regard to the adhesive filler materials 76. The adhesive filler material 80, preferably, acts to prevent relaxation of compression forces urging the bare die into engagement with the heat sink at the thermal interface 50.

Based on the foregoing construction, the effectiveness of the heat transfer operation thereof is self-evident. However, to supplement such disclosure, the present invention provides for a method of transferring heat from a bare die microelectronic device to a heat sink assembly comprising: supporting a heat sink assembly independently of a bare die microelectronic device; and, urging a surface of a bare die microelectronic device into direct heat transfer relationship at a thermal interface with a heat sink assembly under controlled forces. In a preferred embodiment, the process is enhanced by placing a thermal interface material at the thermal interface between the bare die microelectronic device and heat sink assembly. Moreover, the aforenoted urging includes a force applying mechanism that is actuatable to deliver the controlled forces to the bare die microelectronic device to urge the latter into the heat transfer relationship with the heat sink assembly.

The embodiments and examples set forth herein were presented to best explain the present invention and its practical applications and to thereby enable those skilled in the art to make and use the invention. However, those skilled in the art will recognize that the foregoing description and examples have been presented for the purposes of illustration and example only. The description set forth is not intended to be exhaustive or to limit the invention to the precise forms disclosed. In describing the above preferred embodiments illustrated in the drawings, specific terminology has been used for the sake of clarity. However, the invention is not intended to be limited to the specific terms selected. It is to be understood that each specific term includes all technical equivalents that operate in a similar manner to accomplish similar purposes and yet to be developed equivalents. Many modifications and variations are possible in light of the above teachings without departing from the spirit and scope of the appended claims.

What is claimed is:

1. Apparatus comprising: a bare die microelectronic device supported upon a substrate; a heat sink assembly, a heat sink mounting assembly for mounting the heat sink assembly independently from the bare die microelectronic device and the substrate; and, a force applying mechanism that loads, under controlled forces, a surface of the bare die microelectronic device into a direct heat transfer relationship at a thermal interface with the heat sink assembly.

2. The apparatus of claim 1 further comprising: placing a thermal interface material at the thermal interface between the bare die microelectronic device and heat sink assembly to transfer heat effectively.

3. The apparatus of claim 1 further comprising: a surface mount assembly that couples the bare die microelectronic device to a first surface of a printed board.

4. The apparatus of claim 3 wherein the force applying mechanism delivers the controlled forces to a second surface of the printed board that is opposing to the first surface.

5. The apparatus of claim 1 wherein the force applying mechanism includes at least a spring member that is actuated by an actuating member for applying the controlled forces.

6. A method of transferring heat from a bare die microelectronic device supported upon a substrate to a heat sink assembly comprising: supporting the heat sink assembly independently from the bare die microelectronic device and from the substrate; and, urging a surface of a bare die microelectronic device into direct heat transfer relationship at a thermal interface with a heat sink assembly under controlled forces.

7. The method of claim 6 further comprising: placing a thermal interface material at the thermal interface between the bare die microelectronic device and heat sink assembly.

8. The method of claim 6 wherein the urging includes a force applying mechanism that is actuatable to deliver the controlled forces to the bare die microelectronic device to urge the latter into the heat transfer relationship with the heat sink assembly.

9. The method of claim 8 further comprising supporting the bare die microelectronic device on a printed board through a surface mount assembly.

10. The method of claim 9 wherein the force applying mechanism delivers the controlled forces to a surface of the printed board that is opposed to a surface upon which the bare die microelectronic device is mounted.

11. A computer system comprising:
a computer housing assembly;
a printed board mounted in the computer housing assembly;

a bare die microelectronic device mounted upon a substrate, the substrate mounted upon the printed board;

a heat sink assembly, a heat sink mounting assembly for mounting the heat sink assembly on the computer housing assembly independently from the bare die microelectronic device and the substrate; and, a force applying mechanism that loads, under controlled forces, a surface of the bare die microelectronic device into a direct heat transfer relationship at a thermal interface with the heat sink assembly.

* * * * *